(12) United States Patent
Robert

(10) Patent No.: US 7,723,141 B2
(45) Date of Patent: May 25, 2010

(54) ENCAPSULATION IN A HERMETIC CAVITY OF A MICROELECTRONIC COMPOSITE, PARTICULARLY OF A MEMS

(75) Inventor: Philippe Robert, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 29 days.

(21) Appl. No.: 11/684,732

(22) Filed: Mar. 12, 2007

(65) Prior Publication Data

US 2007/0218585 A1    Sep. 20, 2007

(30) Foreign Application Priority Data

Mar. 16, 2006    (FR)    ................................. 06 50902

(51) Int. Cl.
*H01L 21/00*    (2006.01)
(52) U.S. Cl. ........................ 438/48; 438/50; 438/106; 438/108; 257/E21.567; 257/E21.606; 257/E21.703
(58) Field of Classification Search ............... 438/48, 438/50, 106, 108, 422, 456; 257/E21.567, 257/E21.606, E21.703, E21.705
See application file for complete search history.

(56) References Cited

U.S. PATENT DOCUMENTS

| | | | | |
|---|---|---|---|---|
| 6,297,072 | B1 * | 10/2001 | Tilmans et al. | ............... 438/106 |
| 6,335,224 | B1 * | 1/2002 | Peterson et al. | ............... 438/114 |
| 6,635,509 | B1 * | 10/2003 | Ouellet | ........................ 438/106 |
| 2003/0048520 | A1 * | 3/2003 | Ma et al. | ..................... 359/295 |
| 2005/0250253 | A1 | 11/2005 | Cheung | |
| 2006/0049471 | A1 | 3/2006 | Diem et al. | |
| 2006/0108675 | A1 * | 5/2006 | Colgan et al. | ............... 257/684 |

FOREIGN PATENT DOCUMENTS

| | | |
|---|---|---|
| EP | 0 525 764 A2 | 2/1993 |
| EP | 1 167 979 A2 | 1/2002 |
| FR | 2 849 014 | 6/2004 |
| JP | 5-157622 | 6/1993 |

OTHER PUBLICATIONS

B. Diem, et al. "Polysilicon Packaging and a New Anchoring Technology for Thick SOI MEMS-Dynamic Response Model and Application to Over-Damped Inertial Sensors", IEEE, 2005, pp. 527-530.
U.S. Appl. No. 11/721,128, filed Jun. 7, 2007, Lai.

* cited by examiner

*Primary Examiner*—Alexander G Ghyka
*Assistant Examiner*—Abdulfattah Mustapha
(74) *Attorney, Agent, or Firm*—Oblon, Spivak, McClelland, Maier & Neustadt, L.L.P.

(57) ABSTRACT

To produce a structure of a micro-electro-mechanical system (MEMS) in a hermetic cavity (38) of a microelectronic device (50), a prepared cover (30) and substrate (10) are bonded by means of silicon direct bonding (SDB). To optimise the preparation of surfaces by means of wet cleaning without impairing the properties of the MEMS (22), i.e. without causing adhesions, the MEMS structure (22) is not released during bonding, but attached to the base (12) by means of a sacrificial intermediate layer (16). Said layer is removed once bonding has been carried out by injecting HF vapour via a vent (40) opening into the cavity (38).

17 Claims, 3 Drawing Sheets

ENCAPSULATION IN A HERMETIC CAVITY OF A MICROELECTRONIC COMPOSITE, PARTICULARLY OF A MEMS

FIELD OF THE INVENTION

The invention relates to the field of microdevices, particularly micro-electro-mechanical systems (or MEMS) which are isolated in hermetic cavities.

The invention particularly relates to a method to produce such an MEMS enabling the use of controlled and inexpensive cavity bonding not impairing the performances of the components located therein.

The invention also relates to characteristic intermediate devices according to the method.

STATE OF THE RELATED ART

Micro-electro-mechanical systems, actuators or sensors, are experiencing increasing development. In numerous cases, the active component is preferentially isolated in a hermetic cavity with respect to gas and moisture, so as to, for example, limit its ageing or increase measurement reliability. It may also be desirable to control the atmosphere inside the cavity, for example by means of a neutral gas making it possible to prevent any chemical reaction, or bond the cavity in a more or less advanced vacuum. The creation of these cavities, i.e. the encapsulation of the microsystems (more commonly referred to as "packaging") is thus a key for the development of microdevices.

The packaging may be carried out on the device itself, with positioning of the chip in a hermetic housing for example. However, this option is relatively expensive, and limits the miniaturisation of assemblies. Another possibility in terms of expansion relates to encapsulation on a substrate scale.

In this way, it is possible to produce a tight cavity around the microsystem by means of suitable surface technologies, an option referred to as "thin layer packaging", for example described in the document EP-A-0 525 764. The problem is that it is very difficult to obtain a very good vacuum or a controlled atmosphere in the cavity.

Another option consists of using a cover transferred by means of hermetic bonding around the microsystem ("Wafer-level packaging"). As the use of adhesion of the component forming the cover, conventionally using a polymer adhesive, involves very poor performances with respect to the hermeticity, other types of bonding have been developed.

For example, anodic bonding is used for transfer with a glass component. However, the differential heat expansion between glass and silicon has an adverse effect on performances and rules out this technology for some MEMS.

Eutectic bonding makes it possible to obtain reliable and stable results. However, this technology, which is difficult to control, applies significant constraints on surface qualities (particularly, an absolute absence of native oxides on the silicon which complicates large-scale use).

Silicon direct bonding (or SDB) is emerging as one of the most robust and reliable techniques. This well-controlled technique requires a high annealing temperature and, above all, excellent surface qualities. The surface preparation is ideally carried out by means of wet cleaning of the substrates before bonding; however, in the case of substrates comprising MEMS type components wherein a part is suspended at a short distance from a base, this wet process cleaning is not possible due to the high risk of adhesion via capillarity effects. In this case, the solution conventionally used consists of preparing the surfaces only using dry processes, such as plasma treatments, which often result in bonding of mediocre quality.

DESCRIPTION OF THE INVENTION

The invention proposes, among other advantages, to remedy the drawbacks of the existing technologies and use the direct bonding technique with wet surface preparation for composites comprising micro-electro-mechanical systems.

In fact, according to the invention, direct bonding is performed before the release of the MEMS structures: these structures remain attached to the substrate during the cover transfer by a sacrificial layer, particularly consisting of $SiO_2$, which is removed after bonding by means of a vapour treatment, for example with hydrofluoric acid, preventing adhesions. The cavity is subsequently placed in a controlled atmosphere by filling the vents used for the release of the MEMS structure.

More generally, according to the invention, both constituent parts of the microelectronic composite, the cover and the substrate, respectively, are each prepared on their wafer of material, with formations of the cavity and slot of the MEMS structure to a sacrificial layer, preferentially an oxide; the front surfaces of both parts, which will be bonded together, are advantageously made of silicon, with preferentially an SOI substrate for the MEMS. In addition, at least one vent opening into the cavity is formed, on the cover and/or the base. It is possible to have one or more vents per chip to be packaged. These vents may be produced on the cover or the MEMS substrate.

Cleaning, preferentially wet, of the surfaces intended to be placed in contact is then performed conventionally; both parts are positioned for bonding, preferentially by means of direct bonding between the two silicon surfaces following by annealing.

The sacrificial oxide is then etched by means of a preferentially gaseous treatment, particularly by means of HF vapour, via vents, which are finally filled in a controlled atmosphere (vacuum, inert gas, etc.). In particular, the filling may be carried out by means of metal coating followed by melting of a metal bead such as indium, or melting of a glass bead, or creep of a phosphosilicate.

Preferentially, and this is the case of the contact openings located on the same side as the release openings, during the preparation of the constituent parts of the composites, cavities intended for the contact transfer of the MEMS are provided, the metal coating being performed for example at the same time as those of the filling of the vents. If metal coating is required for filling (case of use of indium beads), the metal coating serves as an adhesion layer for the indium bead, for example.

Advantageously, a layer of getter material is placed in the cavity, preferentially on the cover, during the preparation of the parts, and covered with a protective layer, which is removed after the release of the MEMS structure and before placing in a controlled atmosphere.

Another aspect of the invention relates to a specific product of the above method, wherein a cover and a substrate are bonded around a cavity, the substrate comprising etching such as machining of the MEMS structure not yet released, the base of the etching being formed in a sacrificial layer, preferentially an oxide, which attaches the MEMS structure to a base, a protected layer of getter material being also present.

BRIEF DESCRIPTION OF FIGURES

Other characteristics and advantages of the invention will emerge more clearly on reading the following description with reference to the appended figures, which are given for illustrative purposes only and are in no way limitative.

DETAILED DESCRIPTION OF SPECIFIC EMBODIMENTS

The MEMS produced according to the invention may be used in all fields, particularly in the automotive, avionic fields, etc. For example, it may consist of vacuum resonant sensors, RF micro-switches or inertial sensors in a controlled inert gas atmosphere. These different devices are characterised in that they comprise at least one part placed in suspension over a base, and usually in a hermetic cavity. This "MEMS structure" consists of a layer of material machined according to a specific geometry for the purpose of the MEMS which is more or less parallel with the microelectronic composite base, to which it is only attached at a few points: this is referred to as a "released structure".

Figure 1A:
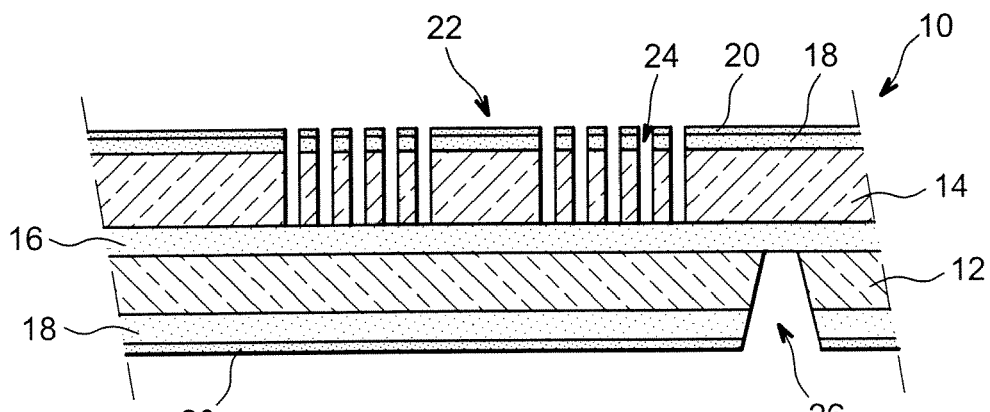
FIGS. 1A to 1E illustrate the steps of a preferential embodiment according to the invention.

According to a preferential embodiment illustrated in FIG. 1A, the MEMS structure is thus produced in a substrate 10 which comprises a base layer 12 and a top layer 14 intended to form the suspended part, separated by a sacrificial layer 16. Preferentially, it consists of an SOI (Silicon On Insulator) substrate 10; the top layer 14 made of SI is for example between 2 μm and 200 μm thick, for example 60 μm, and the intermediate oxide layer 16 is for example between 0.4 μm and 2 μm thick, for example 1 μm; it may also consist of other substrates, possibly produced specifically on an individual base wafer 12; preferentially, the top layer 14 is advantageously made of silicon in order to optimize the bonding.

For future treatments, it is advisable for the surfaces of the substrate 10 to be known in a determined manner, for example either Si or Si topped with an oxide layer 18 on each face (for example, after thermal oxidation giving a 1 μm layer) and a surface passivation 20 (for example, a 0.3 μm SiN deposition).

The various parts to be provided in the final composite are then prepared in the substrate 10. The MEMS structure 22 will be located on the front face or top layer 14 of the substrate 10, which will be bonded with a cover to form a cavity. Litho-etching of the top layer 14 makes it possible to produce the slot 24 of the MEMS structure 22, which, however, remains attached to the base 12 via the intermediate layer 16. In particular, the SiN 20 and $SiO_2$ 18 layers may be etched by means of plasma (RIE method) and the SI layer 14 by means of deep etching (DRIE, anisotropic), stopping on the $SiO_2$ sacrificial layer 16.

On the rear face (i.e. the face of the substrate 10 that will remain external, i.e. the free surface 20 of the base layer 12), if they are provided, contact points 26 are produced by means of photoetching to the intermediate layer 16; for example, the SiN 20 and $SiO_2$ 18 layers may be etched by means of RIE, and the Si base layer 12 may be etched by means of a wet process, by means of KOH or TMAH in particular, or by means of DRIE. The etchings are stopped on the $SiO_2$ sacrificial layer 16.

Figure 1B:
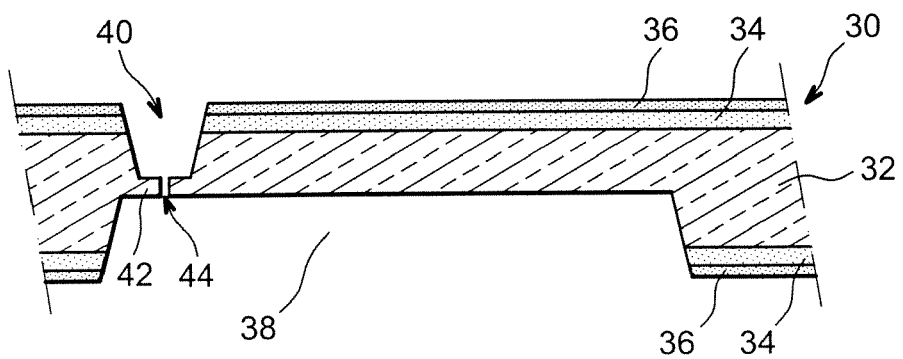

In the same way, the cover 30 of the microelectronic device is prepared, as represented in FIG. 1B. Advantageously, it consists of a silicon substrate 32, which is polished and oxidised on each face (for example on a 1 μm layer 34) whereon a passivation layer 36 is deposited, for example silicon nitride on 0.3 μm. The encapsulation cavity 38 of the MEMS 22 is obtained by means of litho-etching with a mask of the front face, particularly for example RIE etching of the $SiN/SiO_2$ layers 34, 36, followed by KOH or TMAH type wet etching (or DRIE etching if applicable) of part of the layer of substrate 32.

According to the preferential embodiment, the other face of the cover 30 undergoes the same treatment to etch a vent 40. The etching of each face is stopped in time so as to obtain an Si membrane 42, for example approximately 20 μm thick, between the vent 40 and the cavity 38. The membrane 42 is open locally to produce the connection 44 between the vent 40 and cavity 8 either by means of laser drilling (followed if required by cleaning of the slag with KOH or TMAH), or by means of silicon litho-etching using either of the faces (e.g. by means of DRIE). The vents may be opened before or after bonding.

It is possible in the cover 30 to have several vents 40 for each cavity 38; in addition, the vents, or some of them, may be positioned on the wafer of substrate 10 wherein the MEMS 22 is etched and pass from one side of the substrate 10 to the other.

In addition, an alternative would be to use a flat cover 30 and form the cavity 38 in the top layer 14 of a substrate, and etch the base of the cavity 38 obtained in this way to form the slot 24 of an MEMS structure 22 to a deeper sacrificial layer 16.

Although it is described here for a cavity 38 and an MEMS structure 22, it is clear that the invention is not limited thereto. In particular, it is possible to associate other etchings for each chip produced in this way, and above all etch several cavities and structures on the same wafer 10, 30, at the same time, in order to produce a wafer containing several chips which will be separated once the hermeticity of the cavities has been guaranteed.

Figure 1C:
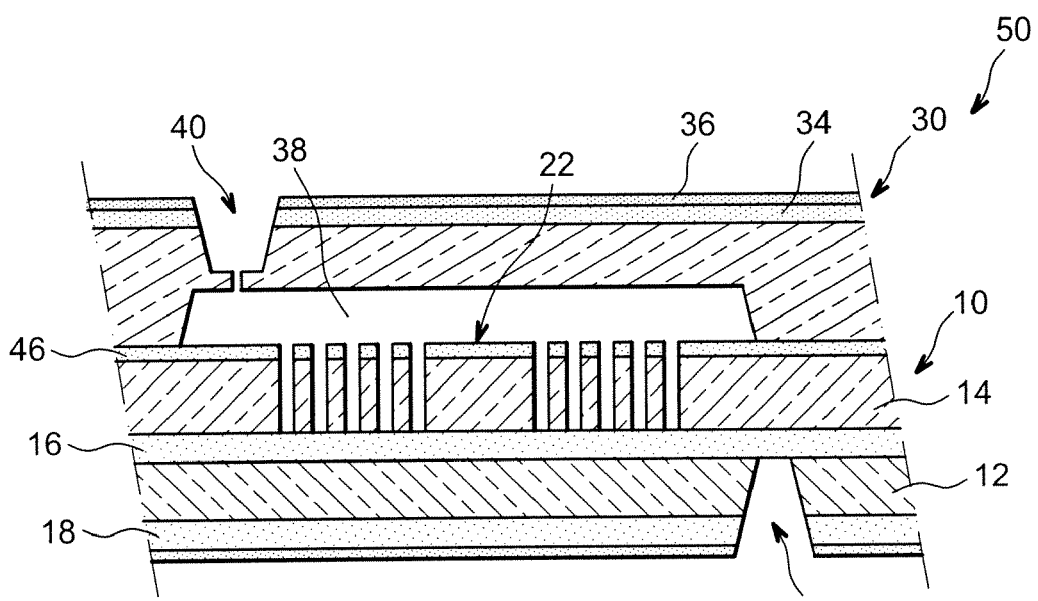

The cover 30 is then transferred on the base 10 and then bonded: FIG. 1C. To this end, both front faces intended to be placed in contact are prepared and, in particular, the passivation layer 20, 36 is etched, for example by means of wet etching, and the oxide layer 18, 34 is removed. After wet preparation on the layers 14, 32, the direct bonding between both cleaned faces 46 is performed, followed by annealing, for example at 1000° C. In this way, a product 50 comprising a hermetic cavity 38 but opening onto a face via a vent 40, open or not, and wherein the machining 24 of a MEMS structure 22 which is not released, or only partially released, but is attached to the base 12 by a sacrificial layer 16, is obtained.

Figure 1D:
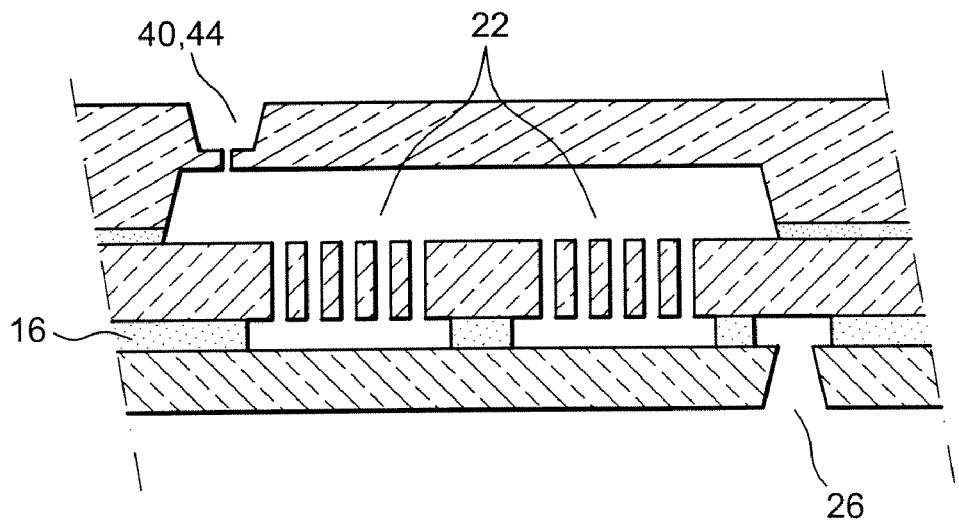

In order to release the MEMS structure 22, etching of the intermediate layer 16 is performed, by means of a vapour phase method in order to prevent adhesion due to capillarity between the MEMS substrate 14 and the base 12: FIG. 1D. For example, the $SiO_2$ layer 16 may be etched by means of HF vapour via the vent 40, 44. In parallel, the sacrificial layer 26 is etched at the contact points 26 in order to provide the connection with the MEMS structure 22.

According to an advantageous option, the release of the MEMS structure 22 may be started before bonding (between the steps represented in FIGS. 1A and 1C), on the substrate wafer 10, after DRIE etching: it can be envisaged to perform preliminary etching by means of HF vapour or conventional wet etching, which enables a quicker HF vapour etching time after bonding.

The microelectronic device is thus created, apart from the placing of the cavity 38 in a controlled atmosphere.

Figure 1E:
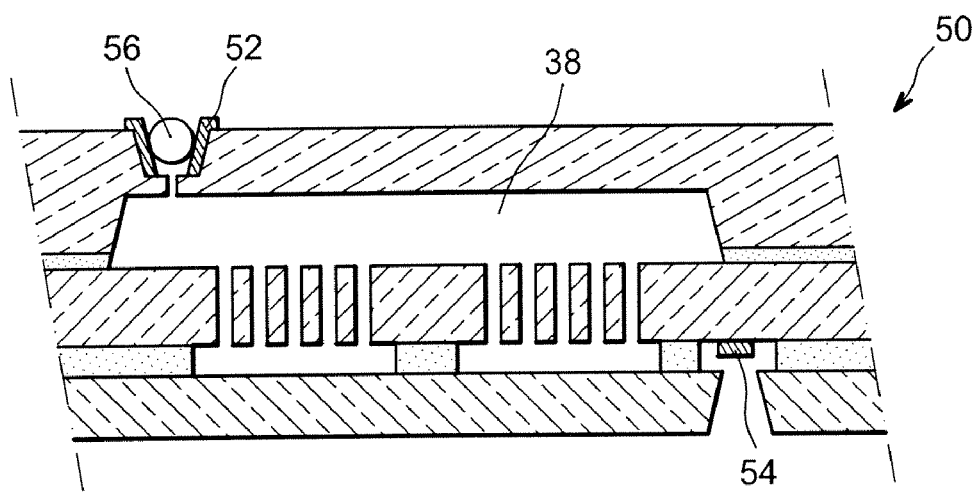

According to an option illustrated in FIG. 1E, the placing in a controlled atmosphere is carried out in conjunction with filling with a meltable metal bead. A mechanical mask is used to deposit on the vent 40 a metal coating 52 compatible with the selected filling, for example a Ti/Ni/Au deposition (adhesion layer). In parallel, the metal coating 54 of the contacts 26 of the MEMS 22, for example by means of Ti/Ni/Au, may be performed by means of a mask on the other face. A meltable bead 56, particularly an indium bead, is positioned in the vent 40, and subjected to vacuum melting (or in a controlled atmosphere): the placing of the cavity 38 in a controlled atmosphere is achieved at the same time as its hermeticity, the bead 56 blocking the orifice 44 completely by melting in the cavity 40.

Figure 2A:
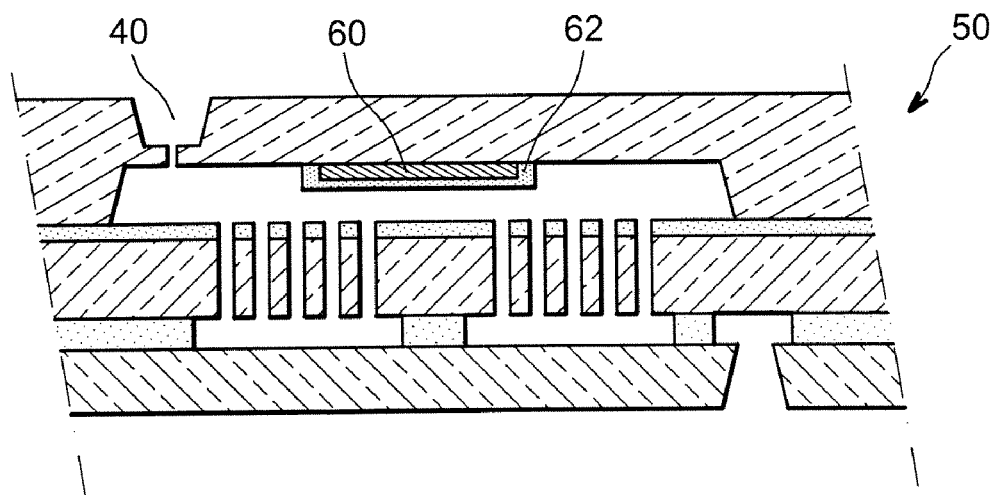
FIGS. 2A and 2B show an advantageous alternative in the embodiment of the invention.
Figure 2B:
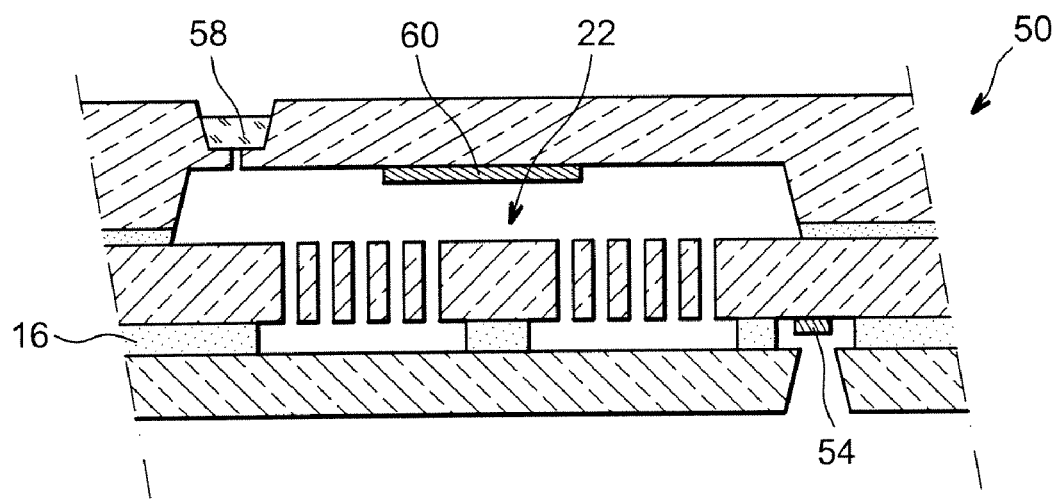

Advantageously, the filling with indium may be replaced by filling with glass 58, in bead or powder form; in this case, the release hole 40 should not be metal coated; an example is illustrated in FIG. 2B. This option offers the advantage that the heat expansion coefficient of the sealing material is similar to that of silicon, an advantage which may be decisive to ensure a low dependency of sensors to temperature and improves the reliability of the hermeticity.

According to another option, and particularly for small vents 40, particularly less than 1 μm in diameter and wherein the membrane 42 does not exceed a few microns of thickness, the filling may also be performed by depositing a phosphosilicate type layer (PSG), which will then be subjected to creep by means of a heat treatment, vacuum or controlled atmosphere.

In this respect, reference may be made to the article by B. Diem et al. "Polysilicon packaging and a new anchoring technology for thick SOI mems-dynamic response model and application to over-damped inertial sensors", Transducers 05, 13$^{th}$ Int; Conference on Solid State Sensors, Actuators and Microsystems, Seoul, Korea, Jun. 5-9, 2005.

In addition, using the method according to the invention, it is possible to also deposit a layer of getter material 60 in the cavity 38, in order to retain the quality of the vacuum over time by means its absorption properties. According to a preferential embodiment illustrated, a getter layer 60 is deposited on the cavity 38 when it is produced (FIG. 2A), and protected, for example by means of a polymer 62 resistant to the SDB bonding preparation (i.e. particularly the silicon nitride etching and wet surface cleaning) and the HF vapour release etching.

After bonding and release of the MEMS structure 22 with HF vapour (i.e. after the step represented in FIG. 1D), and before high-temperature bonding annealing, the polymer 62 is removed, either by means of O$_2$ plasma (via the release hole 40), or by means of sublimation in the case of the use of specific polymer that can be sublimed by means of heat treatment: FIG. 2B. Filling is performed simultaneously or afterwards.

In this way, using the method according to the invention, it is possible to obtain:
   a good production yield due to the use of well-controlled conventional SDB bonding,
   good reliability, due to the use of SDB bonding ensuring high-quality mechanical strength and hermeticity,
   good performances on the encapsulated sensors 22, particularly with the use of a glass filling 58 with a heat expansion coefficient suitable for that of silicon 12, 14, 32,
   possible inclusion of a getter 60, with the use of a temporary protection 62, which increases the isolation performances of the MEMS structure 22 further in the cavity 38 with respect to the outside.

According to an alternative embodiment described above, on the MEMS wafer, after DRIE etching and before bonding, the structures are pre-released by means of HF (vapour or conventional wet etching). The advantage is that the HF vapour etching time before bonding is quicker. When a pre-release or a partial release (etching such that the zones of the MEMS liable to stick under the effect of capillarity remain attached by the sacrificial layer to a limited zone), time is saved as the etching may be performed using a wet process. Even if it is performed by means of HF vapour, this etching is performed on the entire surface of the substrate and therefore is more effective than when the HF vapour needs to pass through a vent. The pre-etching time is adapted according to the size of the MEMS.

The invention claimed is:

1. A method to produce a microelectronic device comprising a micro-electro-mechanical system (MEMS) structure in a hermetic cavity comprising:
   providing a substrate comprising a base layer, a sacrificial intermediate layer and a top layer,
   machining the MEMS structure in the top layer up to the intermediate layer,
   independently creating an encapsulation cover comprising a cavity,
   creating at least one vent opening into the cavity in the cover and/or the substrate,
   transferring and bonding the cover on the substrate before releasing the MEMS structure being located in the cavity,
   releasing the MEMS structure by HF vapour etching of the sacrificial layer via the vents, and
   filling the vents.

2. A method to produce a microelectronic device comprising a micro-electro-mechanical system (MEMS) structure in a hermetic cavity comprising:
   providing a substrate comprising a base layer, a sacrificial intermediate layer and a top layer,
   creating a cavity in the top layer followed by the slot of the MEMS structure in the cavity and in the top layer up to the intermediate layer,
   independently creating an encapsulation cover,
   creating in the cover and/or substrate at least one vent opening into the cavity,
   transferring and bonding the cover to the substrate before releasing the MEMS structure,
   releasing the MEMS structure by etching of the sacrificial layer via the vents, and
   filling of the vents.

3. A method according to claim 2, wherein releasing the MEMS structure is performed with HF vapour.

4. A method according to claim 1 wherein the top layer of the substrate and the cover are made of silicon.

5. A method according to claim 4 wherein the bonding between the cover and substrate is performed with silicon direct bonding (SDB).

6. A method according to claim 5 wherein, prior to the bonding, the surfaces of the cover and the substrate intended to be in contact are prepared using a wet process.

7. A method according to claim 1 wherein filling the vents comprises placing the cavity in a controlled atmosphere.

8. A method according to claim 1, wherein the filling comprises glass or phosphosilicate deposition.

9. A method according to claim 1 wherein the filling is preceded by depositing a metal layer and the filling comprises melting a metal bead.

10. A method according to claim 1 further comprising depositing a getter layer on the cover before the bonding.

11. A method according to claim 10 further comprising deposition a protective layer on the getter layer.

12. A method according to claim 11 comprising removing the protective layer after the release of the MEMS structure.

13. A method according to claim 1 further comprising creating cavities intended for contacts in the base layer before bonding.

14. A method according to claim 13 wherein the contact cavities are interrupted at the intermediate layer and the method further comprises opening contacts by removing the intermediate layer after bonding.

15. A method according to claim 13 or 14 further comprising metal coating the contact cavities after the release of the MEMS structure.

16. A method according to claim 1 further comprising, before bonding, pre-releasing the MEMS structure.

17. A method according to claim 16, wherein the pre-release comprises preliminary etching.

* * * * *